United States Patent
Spielbauer

(10) Patent No.: US 8,494,182 B2
(45) Date of Patent: Jul. 23, 2013

(54) FEEDBACK LIMITER WITH ADAPTIVE TIME CONTROL

(75) Inventor: Georg Spielbauer, Haselbach (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 1053 days.

(21) Appl. No.: 12/145,986

(22) Filed: Jun. 25, 2008

(65) Prior Publication Data

US 2009/0009251 A1    Jan. 8, 2009

(30) Foreign Application Priority Data

Jun. 25, 2007 (EP) ..................................... 07012387

(51) Int. Cl.
*H03G 7/00* (2006.01)
(52) U.S. Cl.
USPC ........... 381/106; 330/279; 330/278; 330/285; 455/72; 370/202; 333/14; 704/225
(58) Field of Classification Search
USPC ............. 381/106; 330/278, 279, 285; 455/72; 370/202; 333/14; 704/225
See application file for complete search history.

(56) References Cited

U.S. PATENT DOCUMENTS

| 4,761,816 A | 8/1988 | Fukasawa |
| 5,832,444 A * | 11/1998 | Schmidt ........................ 704/500 |
| 2005/0123153 A1 | 6/2005 | Toki |

FOREIGN PATENT DOCUMENTS

| JP | 01185010 | 7/1989 |
| JP | 01185011 | 7/1989 |
| JP | 04322506 | 11/1992 |
| JP | 05175770 | 7/1993 |

OTHER PUBLICATIONS

G.W. McNally: "Dynamic Range Control of 1-15 Digital Audio Signals", Journal of the Audio Engineering Society, vol. 32, No. 5, May 1984, pp. 316-327.

\* cited by examiner

*Primary Examiner* — Kimberly Rizkallah
*Assistant Examiner* — Timor Karimy
(74) *Attorney, Agent, or Firm* — O'Shea Getz P.C.

(57) ABSTRACT

The invention relates to a compressor and method for amplifying an input signal with a controlled gain. An output signal representing the input signal is amplified by an initial gain and a signal level of the input signal or of the output signal is compared with a threshold level. If the signal level is below the threshold level, the initial gain value is updated using an adaptive control characteristic, and if the signal level is above the threshold level, the initial gain value is updated using a fixed control characteristic or an adaptive control characteristic respectively. The adaptive control characteristic is dependent on the signal level and the fixed control characteristic is independent from the signal level.

17 Claims, 8 Drawing Sheets

US 8,494,182 B2

FEEDBACK LIMITER WITH ADAPTIVE TIME CONTROL

CLAIM OF PRIORITY

This patent application claims priority to European Patent Application serial number 07 012 387.2 filed on Jun. 25, 2007.

FIELD OF THE INVENTION

The invention relates to a circuit for reducing the dynamic range of audio signals.

RELATED ART

A commonly encountered problem in audio systems is that the maximum input levels of system components are overdriven by an audio signal, leading to undesirable distortion and even, in certain circumstances, to system damage. However, it may be desirable to limit the signal level in transmission systems, for example, to prevent derogation of the hearing of listeners. In a noisy environment it may also be desirable to amplify quieter passages beyond the ambient noise level so that they can be perceived by the listener.

Regardless of whether a low level is to be increased or a high level is to be limited (using so-called limiters, for example), the result is a reduction in the dynamic range of the audio signal in both cases, that is a reduction in the difference between the minimum and maximum level of the audio signal. A so-called "dynamic compression" is particularly beneficial in vehicles, where, on the one hand, the ambient noise level is very high, which can be improved by increasing the low signal levels, and, on the other hand, the power of the audio system is limited due to the rather low level of the power supply in vehicles, which can easily lead to distortion at high signal levels.

In audio engineering a compressor or limiter refers to a circuit in the group of controlled amplifiers, or to a correspondingly programmed digital signal processor, used to limit the dynamic range of a signal. Thereby the dynamic range of an audio signal is reduced, while retaining the original characteristic of the audio signal (e.g., music).

Compressors and limiters reach their limits once different dynamic changes occur in the input signal at the same time in different frequency ranges independently of one another which is typically the case for audio signals, for example, music. Typical unwanted effects due to non-ideal behavior of compressors are so called "volume pumping", harmonic distortion and similar artifacts.

Different compressor concepts are known each having certain insufficiencies either concerning volume pumping effects or concerning harmonic distortion. There is a general need to provide an improved method for controlled amplifying a signal in order to reduce its dynamic.

SUMMARY OF THE INVENTION

A method for amplifying an input signal with a controlled gain includes providing an output signal representing the input signal amplified by an initial gain and determining a signal level of the input signal or of the output signal. The signal level is compared to a threshold level, and if the signal level is below the threshold level (release mode), the initial gain value is updated using an adaptive control characteristic. If the signal level is above the threshold level (attack mode), the initial gain value is updated using a fixed control characteristic or an adaptive control characteristic. The adaptive control characteristic is dependent on the signal level and the fixed control characteristic is independent from the signal level.

The initial gain value may be updated according to the fixed control characteristic if the signal level exceeds the threshold level by more than a given excess value and the initial gain value may be updated according to the adaptive control characteristic if the signal level exceeds the threshold level by less than the given excess value.

A compressor comprises a controlled amplifier having an input terminal receiving an input signal, an output terminal providing an output signal, and a control terminal for controlling the gain of the controlled amplifier. It further comprises a feedback network connected to the control terminal of the controlled amplifier, the feedback network having a first mode of operation (attack mode) and a second mode of operation (release mode) for controlling the gain of the controlled amplifier, where the feedback network is adapted for controlling the gain using, dependent on an signal level of the input signal or of the output signal, an adaptive control characteristic or a fixed control characteristic respectively in the first mode of operation and an adaptive control characteristic in the second mode of operation, the adaptive control characteristic being dependent on the signal level and the fixed control characteristic being independent of the signal level.

DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

In audio engineering, a compressor or limiter refers to a circuit from the group of controlled amplifiers, or to a correspondingly programmed digital signal processor, used to limit the dynamic range of a signal. Thereby the dynamic range of an audio signal is reduced, while retaining its original characteristic (e.g., of music). A control signal used to control the gain of a controlled amplifier is derived from the level of the audio signal (usually, but not always, the signal to be processed), for example, using an envelope tracer. The amplifier adjusts the level of the processed signal by decreasing its gain if the level of the audio signal becomes too high, that is, if its level exceeds a certain (often predefined) threshold level. Conversely the gain of the controlled amplifier is increased if the level of the audio signal falls below the threshold level again. The dynamic range of the processed signal is thus reduced.

Figure 1:
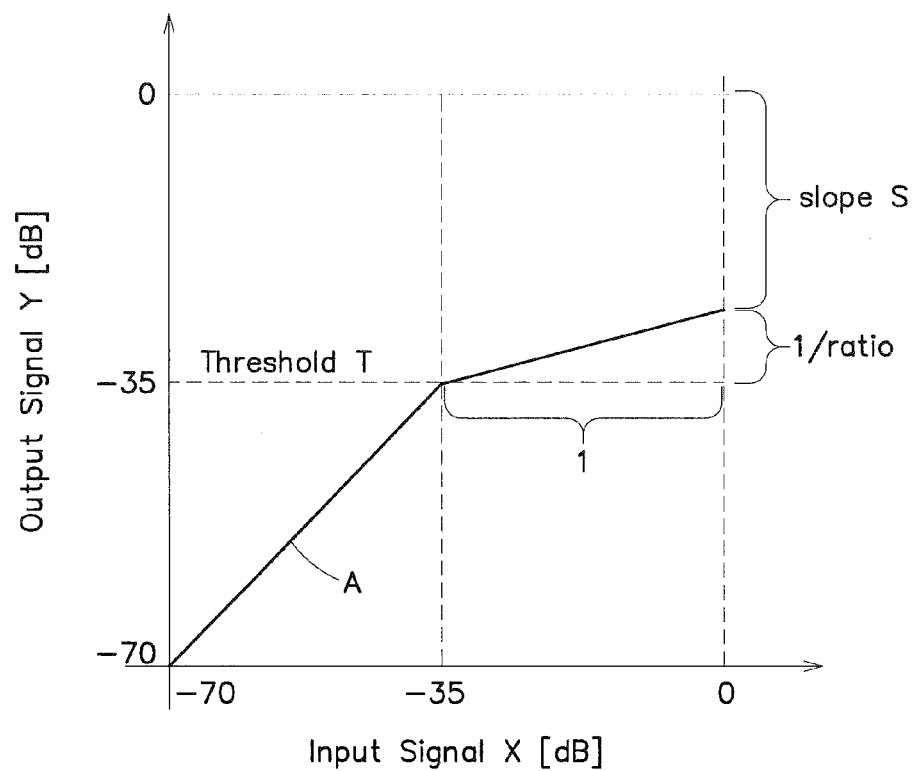
FIG. 1 illustrates the static transfer characteristic of a compressor (or limiter)

The static transfer characteristic is depicted in FIG. 1. The abscissa value designates the input signal level and the ordinate value the output signal level in decibel. For input levels up to the threshold level T (−35 dB in this example) the gain of the compressor is unity or zero decibel (i.e., the output signal corresponds to the input signal). For input levels above the threshold level the gain is reduced corresponding to a compression ratio which is 4:1 in the case shown in FIG. 1. The compression ratio is formally defined as:

$$\text{ratio} = (X-T)/(Y-T), \text{ for } X>T \text{ and } y>T \quad (1)$$

where threshold T, output signal Y, and input signal X are measured in decibel. It represents the ratio between the excess (X−T) of the input level over the threshold level T and the excess (Y−T) of the output level over the threshold level T. For example, a ratio of 2:1 means an attenuation of the input signal level above the threshold level by a factor of 2. The total static gain $GAIN_{STAT}$ of the compressor is thus given by:

$$GAIN_{STAT} = (T-X)(1-1/\text{ratio}) \text{ for } X>T, \quad (2)$$

where the gain $GAIN_{STAT}$ is also measured in decibel. For input signal levels below the threshold level T the static gain $GAIN_{STAT}$ is, as already mentioned, zero decibel. Compressors may have a compression ratio between about 1.3:1 and 3:1. Compressors with a ratio above 8:1 often are referred to as limiters, though no precise definition exists.

The factor (1-1/ratio) represents the deviation of the gain from a linear curve and is also called "slope" S. Consequently the static gain $GAIN_{STAT}$ can be expressed in terms of slope s as:

$$GAIN_{STAT} = (T-X)s \text{ for } X>T. \quad (3)$$

A limiter therefore generally has a slope s between approximately 0.9 and 1.0, while a compressor has a slope between approximately 0.1 and 0.5.

It is clear that the gain of any controlled amplifier cannot be adjusted instantaneously. The adjustment of the gain is usually determined by the dynamics of a feedforward or a feedback circuit, which can be described (amongst others) by directly or indirectly configurable parameters "attack time" $t_A$ and "release time" $t_R$.

Typical design parameters of a compressor/limiter may therefore be:
Threshold T
ratio
attack time $t_A$
release time $t_R$.

The threshold level T and the ratio have already been defined above. The attack time $t_A$ defines the time lag from when the threshold level T is exceeded to the time of maximum compression. A favorable attack time depends greatly on the signal to be processed. It is often chosen to be very short (e.g., 1 to 50 milliseconds). The release time $t_R$ defines how fast the compression of the signal is removed once the level falls below the threshold, that is, the time lag from when the threshold level T is undershot to the time of no compression of the signal. An example is given below with reference to FIG. 2.

Problems may arise, when different dynamic changes occur in the input signal simultaneously in different frequency ranges independently from one another which is typically the case for audio signals, for example, music. Typical compressors/limiters adapt to the component of the audio signal with the highest energy (often the bass or snare drums) leading to the undesired effect of "volume pumping". A rise in level, for instance, in the bass range of the audio signal therefore leads to an unwanted reduction of the overall signal level.

Common to all known limiters is that they work either consistently with fixed gain control characteristic (in the feedback or feedforward signal path) or consistently with adaptive characteristic for the attack time $t_A$ and release time $t_R$ parameters throughout the entire frequency and level range, and that they exhibit the disadvantages inherent to their corresponding methods. For example, a fixed characteristic for the attack time parameter may be insusceptible to a large extent to volume pumping, but can cause undesirable signal distortion for audio signals with relatively low frequencies. Other designs of compressors encompass control characteristic for which the attack and release time parameters (or even the compression ratio) are dependent on the amount by which the threshold level is exceeded (adaptive characteristic).

Figure 2:
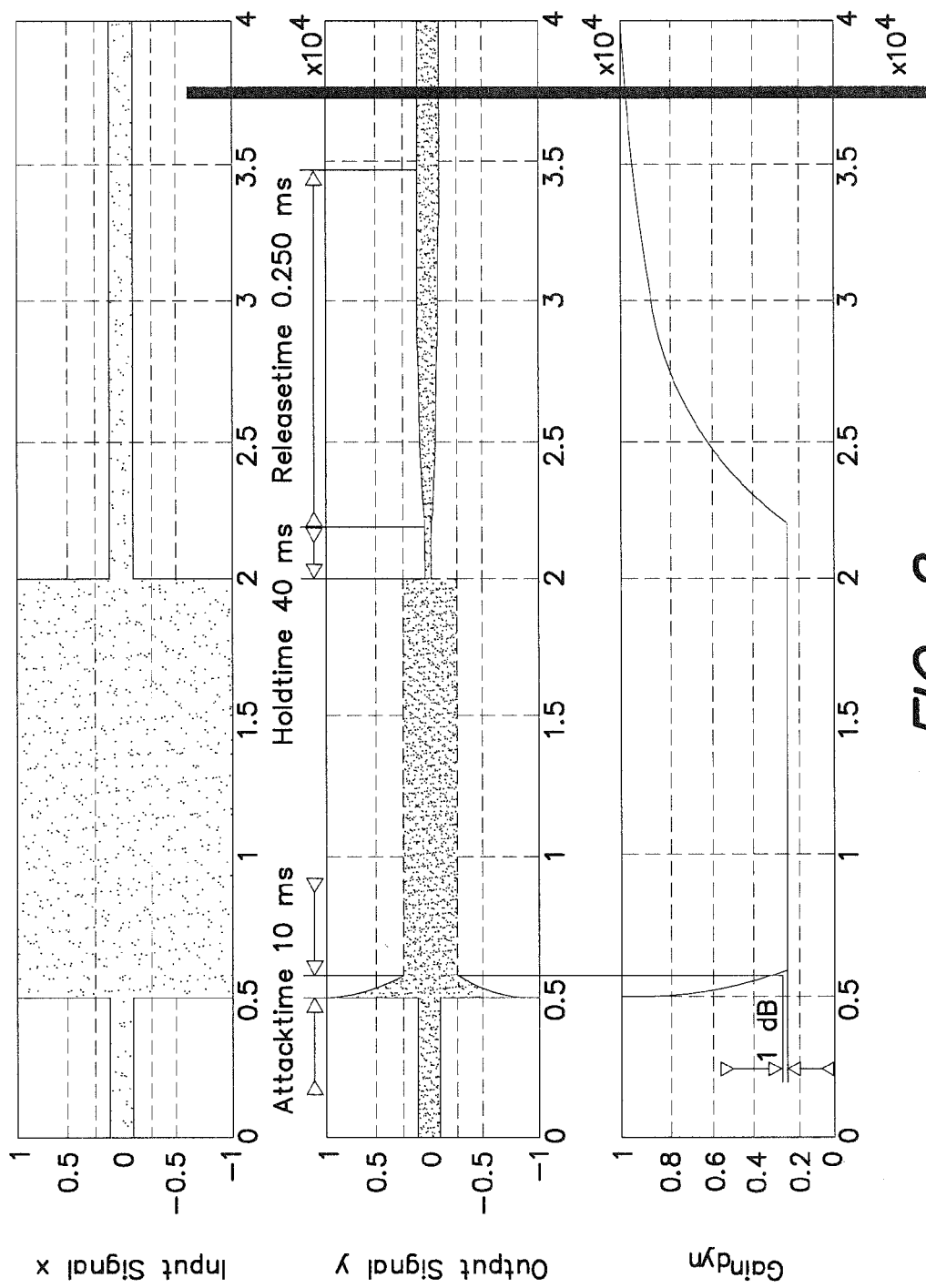
FIG. 2 illustrates the attack time and the release time using a sine burst with a rectangular envelope.

FIG. 2 illustrates characteristics of the output signal y and the compression (dynamic gain $gain_{dyn}$<1) of a limiter with a sine burst with a rectangular envelope as its input signal x. The attack time $t_A$ corresponds to the time required by the controlled amplifier of the compressor/limiter to reduce the level of an input signal x that rises abruptly to a specified value above the threshold level T. This specified value is defined as a specified level value above the threshold T of the compressor—for example, 6, 4 or 1 dB as in the example.

The attack time $t_A$ represents a key parameter for the performance of a compressor/limiter. On the one hand, a very short attack time $t_A$ is required for fast response of the compressor, but on the other hand, natural transient responses are suppressed in audio signals for short attack times $t_A$. This applies particularly to low frequency components of an audio signal which sonic characteristic is thus altered in an undesirable way. In addition, harmonic distortion increases in the case of low frequencies.

The release time $t_R$ represents the time that the controlled amplifier of a compressor needs to return the output signal level to a specified value with reference to the input signal after a prior drop in the level, that is, the input signal has fallen below the specified threshold level and no further compression is needed. The specified value is defined as a certain level below the level of the input signal—for example, −6, −4 or −1 dB as in the example given (FIG. 2).

Likewise, the release time $t_R$ is also a key parameter for the performance of a compressor/limiter. A substantial undesirable artifact is the above-mentioned "volume pumping", which occurs for relatively long release times and which is particularly irritating during quiet passages of an audio signal. Even if the input signal has exceeded the threshold level T only briefly, the gain is then reduced over a relatively long period, which is perceived as distracting when listening to audio signals, for example, music. In contrast, a short release time $t_R$ results in an increase in unwanted distortion and the echo associated with particular instruments—for example, cymbals, is amplified unnaturally.

Moreover, a typical undesirable effect can be seen in FIG. 2 for a compressor/limiter implemented in a feedback structure. The effect is known as "overshoot" and occurs at the beginning of a strong rise in level in the input signal within a short time. Since when implementing a limiter in a digital signal processor (DSP) a current output sample has to be calculated initially from a digitized input sample of the input signal, changes in the level that exceed the limiter's threshold cannot be considered until the next computing cycle, and an overshoot always occurs regardless of the length of the attack time $t_A$. The duration depends on the configured attack time $t_A$.

A further parameter is the "hold time" $t_H$ which defines the interval of time directly following the attack time $t_A$. The hold time $t_H$ is to prevent long continuous tones of a constant level (e.g., as encountered for wind instruments in music signals) from being rendered with a "shaky" quality.

The compressors and limiters discussed below were implemented by suitable algorithms in a digital signal processor (DSP) in order to allow easy variation of the corresponding characteristic and parameters, and to allow a relative and absolute comparison of the extent of undesirable artifacts, such as volume pumping and distortion. A combination of both fixed and adaptive characteristic or control curves for attack and release time parameters are applied in an inventive design of a limiter/compressor. The DSP used for the experimental designs was a Sharc 21065L processor from Analog Devices Inc. The input signals were sampled in all cases using a sampling rate of 48 kHz.

Figure 3:
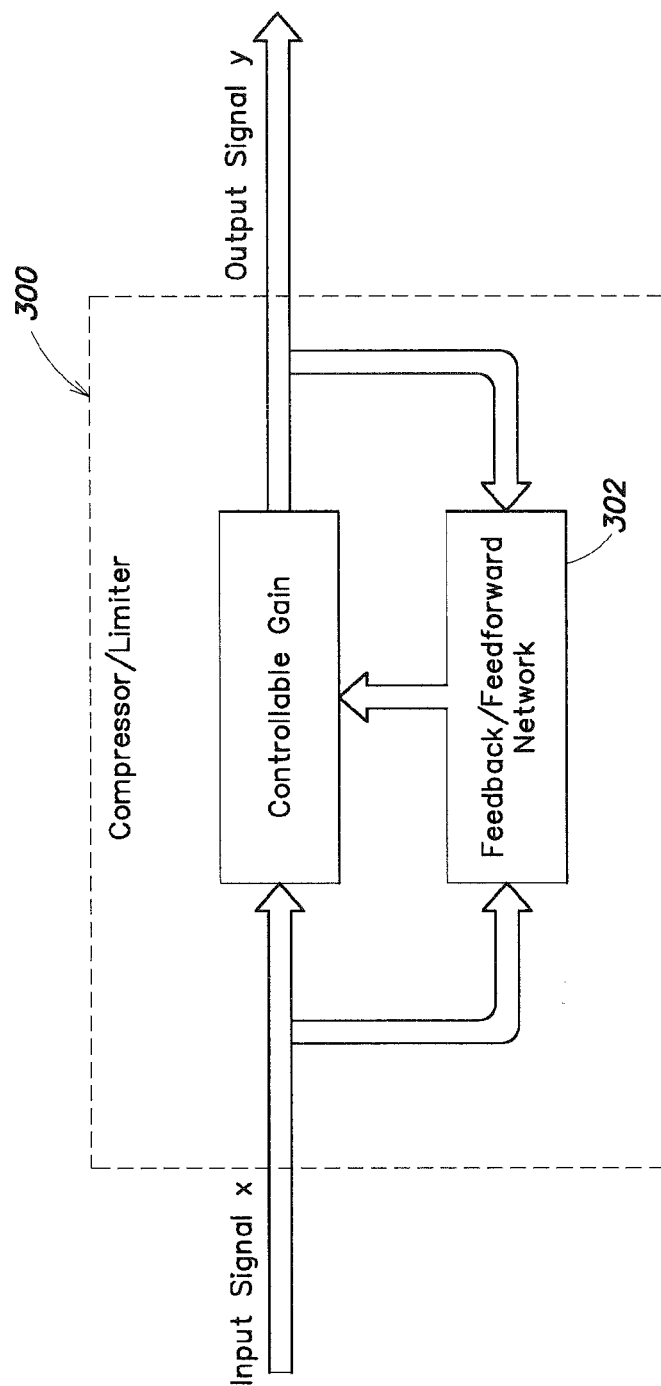
FIG. 3 is a block diagram illustration of a controlled amplifier.

As already mentioned, compressors and limiters derive parameters from the input and/or output signals to control an audio signal using controllable gain amplifier. FIG. 3 is a simple block diagram of a compressor/limiter 300. The control algorithm can be described as a feedback/feedforward network 302, since the variable gain depends from the input signal x and the output signal y and some control parameters (e.g., attack time $t_A$, release time $t_R$, etc.). The three basic structures mainly used for controlled amplifiers are outlined below. Their individual components are explained more closely in a later detailed discussion of the different methods.

Figure 4:
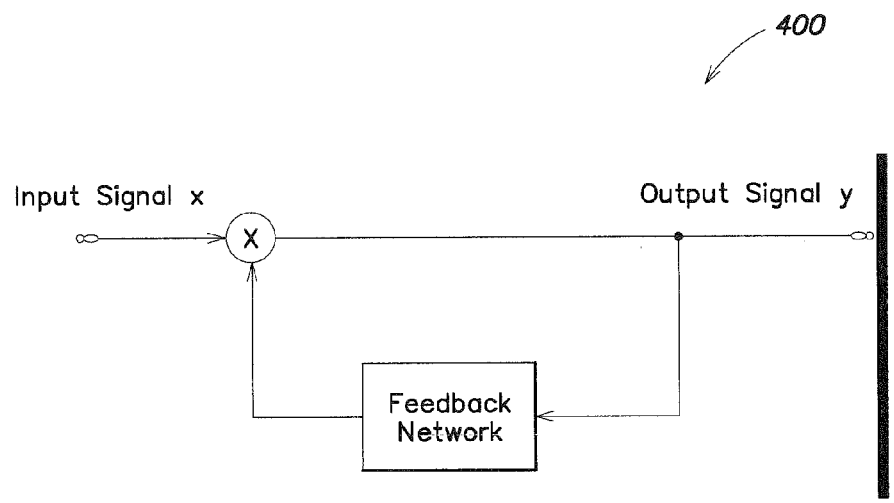
FIG. 4 is a block diagram illustration of a basic feedback structure.

The feedback structure for a compressor/limiter 400 as illustrated in FIG. 4 represents a relatively easy structure to implement, and requires relatively little computing performance by the DSP. The major drawback of the feedback structure is that overshooting necessarily occurs and its application is only useful provided overshooting has no negative effect on the tonal quality of an audio signal.

Figure 5:
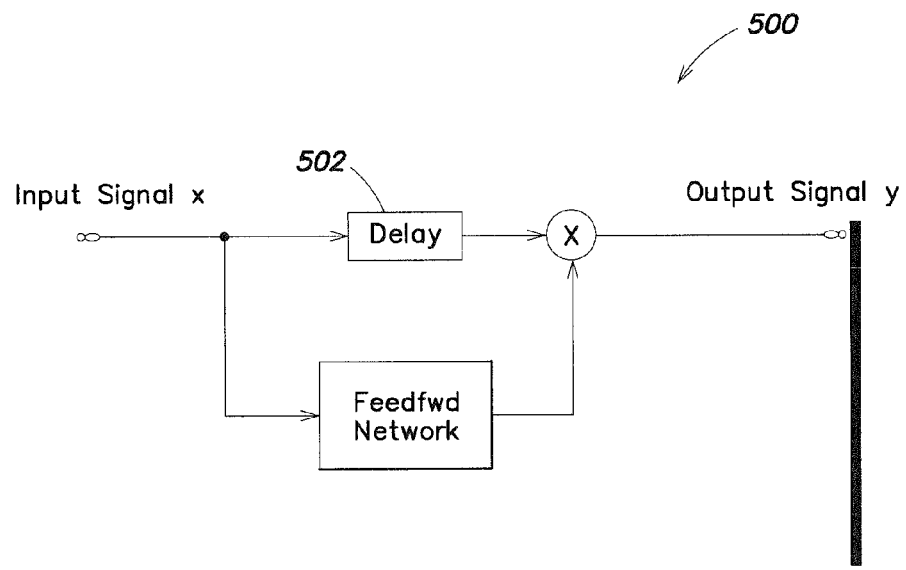
FIG. 5 is a block diagram illustration of a basic feedforward structure.

A feedforward structure of a compressor/limiter 500 as illustrated in FIG. 5 is used particularly if the ratio is to be finitely set, that is for compressors or expanders. Moreover, overshoots can be fully excluded by introducing a delay 502 in the direct signal path, because the control system works by "looking ahead" and can take measures against large rises in level over short spaces in time.

Figure 6:
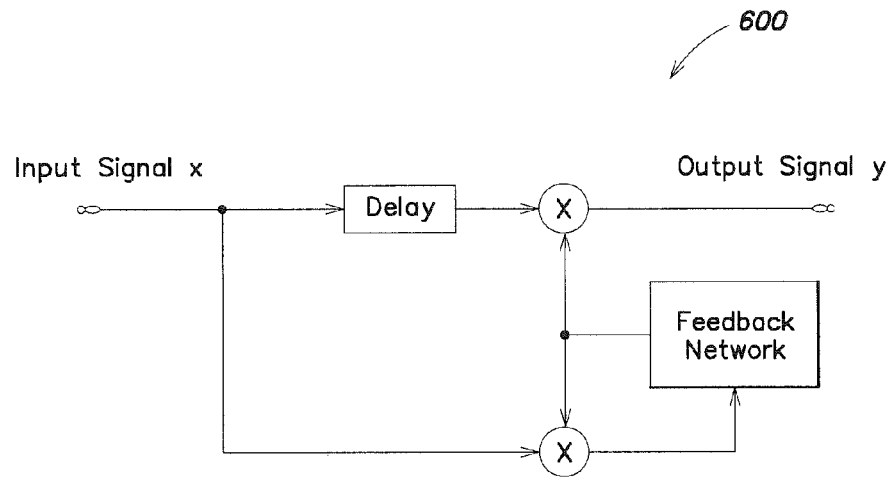
FIG. 6 is a block diagram illustration of a feedforward structure with an underlying feedback loop in the feedforward path.

FIG. 6 illustrates the basic structure of a circuit 600 with feed forward and secondary feedback structure, that is, an underlying feedback loop in the feedforward structure. The objective here is to combine the benefits of a feedback structure and a forward structure to counteract undesirable artifacts, such as distortion, overshooting and volume pumping.

Algorithms and signal structures are described and illustrated below to depict how they have been realized for the three described basic structures (e.g., FIGS. 4 to 6) of limiters and compressors for implementation in the DSP.

Figure 7:
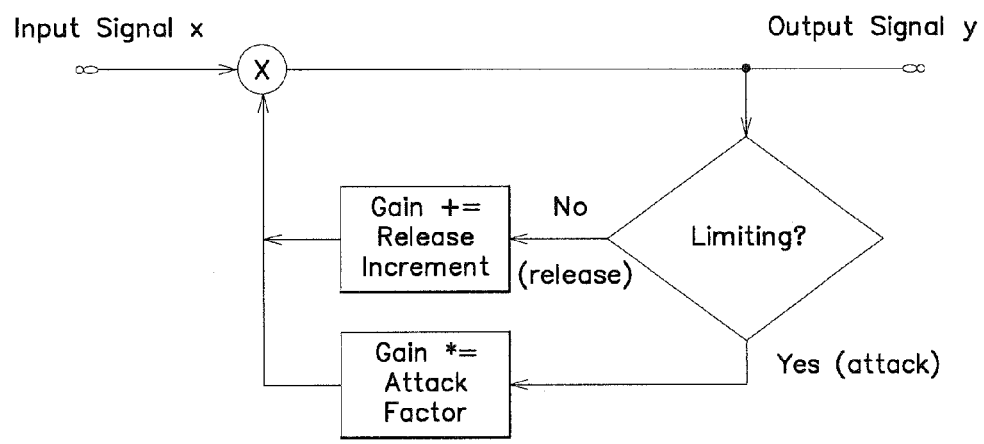
FIG. 7 is a block diagram illustration of a feedback limiter.

The algorithm described below corresponds to a digital implementation of the analog structure of a feedback limiter as shown in FIG. 7. Threshold value T, attack time $t_A$, and release time $t_R$ can be specified as parameters. If the level of the output signal exceeds the specified threshold value T, the algorithm changes into the state "attack" and a new gain is computed for the next cycle of the digital signal sampling of the input signal x by multiplication with an "attack factor". Consequently, the level of the output signal y is attenuated as desired. This action repeats itself using the specified parameters (e.g., threshold T, attack time $t_A$) for each further digital signal sample until the level of the output falls below the defined threshold value T. In this case, the algorithm changes into the state "release".

If the algorithm is in the release state, a release increment is added to the gain. By carrying out an addition, the gain is constantly increased with each step of signal sampling, whereas the multiplication during the attack state causes an exponential reduction in the gain. The attack factor AF is dimensioned in such a way that it reduces the gain during the time the level exceeds the threshold value T with a time constant in dB/s (decibel per second) standardized for a 10 dB level overshoot. The release increment RI is also selected such that the limiter raises the gain with an absolute time constant standardized for a 10 dB level undershoot in increments/s for the period that the level is below the threshold value T. The resulting release time $t_R$ therefore is just as dependent on the values for the threshold value and the 10 dB level as the resulting attack time $t_A$ (adaptive gain control characteristic).

In compliance with the structure shown in FIG. 6, the current output sample is first computed from a digitized input sample and the gain factor. Consequently, any changes in level that occur that exceed the threshold value T of the limiter will not be considered until the next cycle of the computation. Overshooting therefore occurs, regardless of the configured attack time $t_A$. The duration of the overshooting varies with the attack time $t_A$. Attack and release times for processing audio signals may be, for example, 50 μs to 10 ms for the attack time $t_A$ and 50 ms to 3 seconds for the release time $t_R$.

Experimental measurements rendered strong overshooting in the "attack" state as expected, that is, as a response to an abrupt rise in level of the input signal (sine burst). As already mentioned, overshooting cannot be excluded in a limiter design of this kind. The control of the output signal in the release state occurs without recognizably control-related artifacts. Compressors can also be implemented relatively simply using a feedforward structure as shown in FIG. 4. Two algorithms are presented below that work similarly in their basic structure, but that use different filter structures for "release" and "attack".

Figure 8:
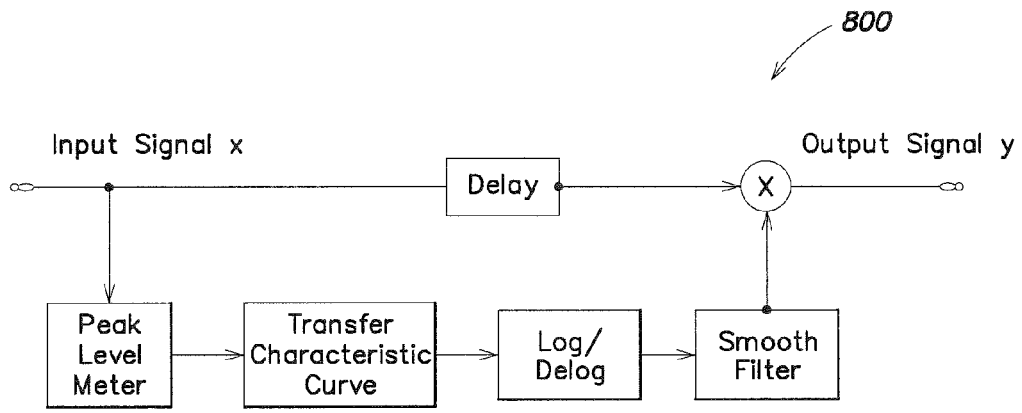
FIG. 8 illustrates a limiter with a feedforward structure and a delay in the direct signal path using a peak-level meter for determining the signal level.

FIG. 8 is a block diagram illustration of another limiter/compressor 800. In this model of a limiter/compressor, the gain control signal is determined by a so-called "sidechain". Here the required control factor for the reduction of the input signal is calculated by a peak level meter, a transfer characteristic curve (representing the static gain) and the use of a log/delog module.

The characteristic curve determines whether the device works as limiter or a compressor, also a combined compressor/limiter characteristic is possible. Combined limiters and compressors each have their own parameters for threshold value T and ratio, but identical times for the release time $t_R$ and attack time $t_A$ are selected for the limiter and compressor in each case in this design. The ripples resulting from the digital logarithmic actions are then filtered out using a so-called smoothing filter. Overshoots can be prevented by using a delay element in the direct signal path to produce an appropriate signal delay (cf. FIG. 8). The duration of the delay depends mainly on the signal delays occurring in the peak level meter and smoothing filter. These delays must be considered when defining the delay in the direct signal path of the signal processing.

To realize the peak level meter shown in FIG. 8, a recursive 1st-order low pass filter is used for exponential determination of the average signal value. The coefficients "attack factor" AF, for the attack time $t_A$, and "release factor" RF, for the release time $t_R$, define the behavior of the peak level meter and therefore of the entire controlled amplifier. The time constants for "attack time" and "release time" are defined in such a way that, if the threshold level T is overshot by 10 dB in the case of "attack time" or undershot by 10 dB in the case of "release time" by the input signal, then the control system will bring about a specified level of 1 dB above or below the threshold level T within this time constants.

The implementation of the logarithmic/delogarithmic module in FIG. 8 demands most of the computing performance of the DSP. Library functions provided by the development environment of the DSP are referred to in this case. These functions have proven themselves to be more than adequate in terms of accuracy for the application required here and are not treated in greater detail in this context. The DSP in such cases requires about 70 clock cycles for a single logarithmic or delogarithmic process.

By the logarithmic/delogarithmic process, the gain value is calculated from the characteristic curve. To do so, the slope is first calculated from the ratio as detailed earlier in order to simplify the subsequent computation.

The use of the smoothing filter in the next step depends on the requirements outlined below. Due to the non-linear nature of the logarithmic and delogarithmic processes, unwanted spectral components occur in the resulting signal. These are sufficiently attenuated in a simple manner by the smoothing filter, which is implemented as a 1st-order low pass filter. Moreover, ripples can arise in the resulting signal due to the digital implementation of the logarithmic process. The ripples would be transferred to the audio signal if an appropriate filter were not used.

Likewise, the signal distortions occurring because of very low values for the attack time are compensated by a suitably selected smoothing time for the smoothing filter. Approximately half of the attack time is chosen as an appropriate value for the smoothing time.

Overshooting can be practically fully suppressed by introducing a delay of, for example, 100 samples, as shown in FIG. 8. This method of "advance" signal analysis enables level peaks, which would otherwise cause overshooting in the output signal, to be detected and appropriate control actions for the delayed input signal to be taken. Here, the gain is reduced over a defined period with suitably selected time constants. It is obvious that each configured delay time has to be selected corresponding to the defined attack time in order to achieve the desired effect.

In the release state the curve for the gain is exponentially rising which, unlike the linear control signal of the limiter of FIG. 7 changes much quicker to normal amplification with a gain of 1 (or 0 dB) whenever the level of the input signal falls below the threshold level. This exponential behavior of the gain has the effect that normal amplification with a gain of 1 is achieved in about half of the time compared to the limiter of FIG. 7. The duration itself is in turn dependent on the extent to which the level of the input signal falls below the threshold level (adaptive control characteristic).

Figure 9:
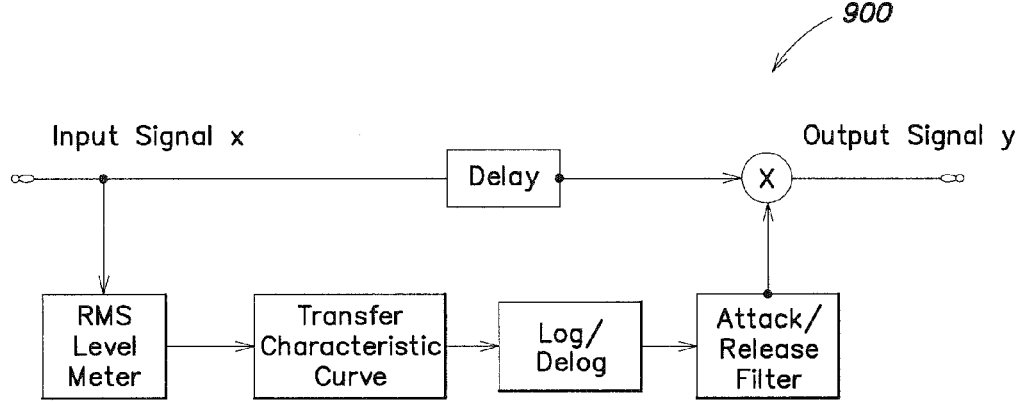
FIG. 9 illustrates a compressor similar to that of FIG. 8, but with a RMS meter for determining the signal level.

The implementation and measurement results of the prototype of a so-called RMS compressor 900 illustrated in FIG. 9. Unlike the limiter/compressor 800 shown in FIG. 8, the effective value (i.e. the root-mean-square value) of the input signal is used as a reference for the compression. This method provides a better reference to the perceived loudness of an audio signal than the peak level measurement described above. Moreover, the effect of volume pumping is reduced in comparison to the method with peak level measurement, because the adjustment of the controlled amplifier to short transient changes of the input signal level responds less sharply. A recursive 1st-order low pass filter is used to determine the RMS value of the input signal x. A time constant with a value of about 50 ms is reliable for determining the average effective value.

The following implementation of attack and release times is in turn realized by a recursive 1st-order system (Attack/Release Filter). Here the actual (dynamic) gain value $gain_{dyn}[n]$ is calculated both for the attack state and for the release state from the addition of the actual weighted input (static) gain value $gain_{stat}[n]$ and the actual gain value $gain_{dyn}[n-1]$ of the previous sample (n-1) using the following equation:

$$gain_{dyn}[n]=(1-\text{coeff})\,gain_{dyn}[n-1]+\text{coeff}\,gain_{stat}[n], \quad (4)$$

where coeff defines the attack factor AF, or release factor RF, which are calculated using the following formula (SR is the sample rate in samples per second):

$$AF=1-\exp(-2.2/(SR\,t_A)) \quad (5)$$

$$RF=1-\exp(-2.2/(SR\,t_R)) \quad (6)$$

An additional hysteresis loop in the decision-making process to operate in the release or the attack state can ensure that unwanted fast switching does not occur between the attack and release control states in the event of signal fluctuations in areas just above and below the threshold values, and is therefore used to smooth the changes in the gain $gain_{dyn}$.

Unlike the limiter described above with reference to FIG. 8, the compressor has an exponentially fading gain in the release state. This is due to the generation of the gain signal for the attack and release stage directly following the delogarithmic process. The occurrence of the familiar overshooting is clearly discernible. In most cases, however, compressors are only used in combination with limiters which are configured with a corresponding delay (as described earlier) to prevent the overshooting.

The feedforward algorithm described below for a limiter/compressor behaves similarly to the design described earlier with reference to FIG. 9. The difference here is that higher order filters are used in the attack and release phases to implement the gain control characteristic. Furthermore, in the system of FIG. 9 the components for processing the release and attack phases are shown separately from each other in order to prevent possible mutual effects. The limiter and compressor differ in the algorithm applied here only in their values for threshold and ratio. The exponentially rising behavior of the gain in the release phase resembles that of the limiter of FIG. 8.

As already described earlier, a more complex design of a limiter/compressor with a feedforward structure and secondary feedback structure combines the advantages of both techniques. In the event of strongly transient impulses, the psychoacoustic effect of pre-coverage is utilized, which renders possible non-linear artifacts due to the response control shortly before a strong impulse to become non-perceptible to the human ear. A subsequent hold time then ensures that no level fluctuations occur in the passages that directly follow, that would, for example, cause volume pumping.

All methods of limitation and compression of audio signals described here have in common that the resulting gain exhibits non-linear behavior and therefore system-inherently causes signal distortions. For this reason, additional analyses have been carried out for the illustrated algorithms. The algorithms were fed with further synthetic signal shapes, such as beat signals, as well as with sequences of real music passages with different musical styles. The analyses were performed by measurement of the changes in signal shapes and by listener tests for assessment of the tonal quality of real music sequences processed by the algorithms. Since these results mainly confirmed the strengths and weaknesses of the limiters that were already recorded by the displayed measurements, no detailed illustration and discussion of the results are given here in order to preserve an uncomplicated structure.

The two main unwanted artifacts occurring in connection with limiters are volume pumping and signal distortion. However, none of the examined methods provide adequate signal quality in regard to the major artifacts of volume pumping and signal distortion for the entire application range for audio signals. In addition, good signal quality is only obtained for certain methods in particular frequency ranges or for configuration with defined parameter values, for example, release times, which further restricts their use for audio signals. It is also evident from the gain control behavior of the examined limiters/compressors explained in detail on the preceding pages that although some of the methods exhibit good gain behavior with very few artifacts in the release operating state once parameters are suitably selected, this does not hold true for the attack phase if the parameters remain unchanged.

Figure 11:
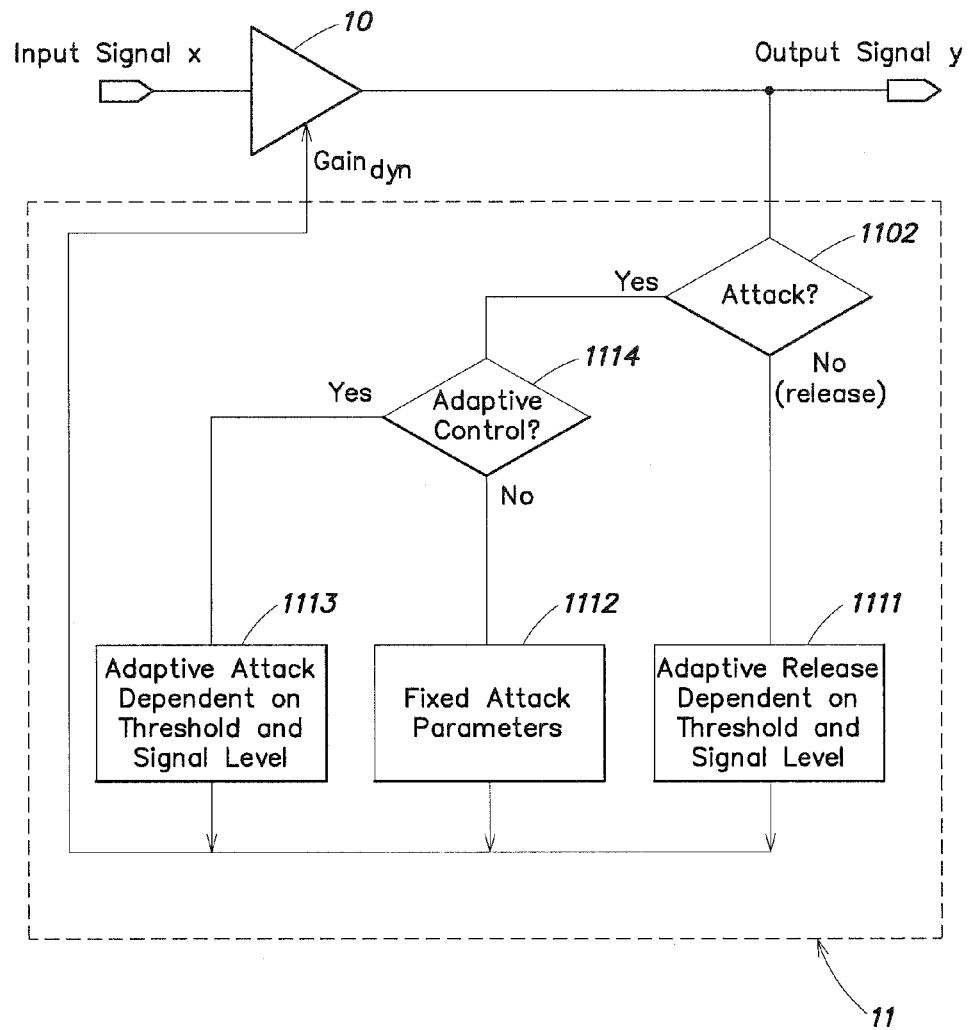
FIG. 11 illustrates an embodiment comprising a compressor/limiter.

The apparatus and method referring to FIG. 11 overcomes these drawbacks by a suitable combination of both fixed and adaptive characteristic curves for the parameters attack time $t_A$ and release time $t_R$ of one or more limiters/compressors implemented using a digital signal processor (DSP), utilizing the corresponding advantages of the discussed circuits. The system shown in FIG. 11 comprises a controllable amplifier 10 receiving an input signal x and providing an output signal y. A feedback network 11 comprises two modes of operation, where the actual mode depends on the level of the input signal x. In the case of FIG. 11, the modes of operation are determined in step 1102 by comparing the level of the output signal y with a threshold level T. If the signal level is below the threshold level T the feedback circuit enters the release state, else the attack state.

In the release state the release parameters (e.g., release time $t_R$, release factor RF, release increment RI) are calculated adaptively dependent on the threshold level and the signal level or the value of the "undershot" of the threshold. Thus an adaptive gain control characteristic 1111 is achieved.

In the attack state the attack parameters (e.g., attack time $t_A$, attack factor AF, etc.) can be either calculated adaptively dependent on the threshold level and the signal level 1112 or a fixed control characteristic is used 1113. The decision to use fixed or adaptive gain control in the attack state is taken in step 1114, for example, in accordance with the extent to which the threshold level T is exceeded by the (output) signal level or on the basis of the frequency spectrum of the input signal—but is not restricted to these two criteria. The input signal can also be evaluated for this decision.

An adaptive gain control characteristic is appropriate for small excess values of the input signal over the threshold level T. The fixed gain control characteristic is appropriate for high excess values of the input signal over the threshold level T. While the fixed characteristic is rather insensitive to volume pumping, the adaptive characteristic regulates the volume more slowly when the input signal approaches the threshold level. This prevents the feedback network from switching between attack and release modes too often which is irritating for the listener and would destabilize the overall system.

Other advantages regarding the reduction of artifacts can be obtained by cascading of identical limiters/compressors with different parameters for the attack time, for example, or by cascading different limiters/compressors or a combination of identical and different limiters/compressors with correspondingly selected parameters. The corresponding blocks 1111-1113 shown in FIG. 11 for adaptive release, fixed attack and adaptive attack can also be designed in the form of cascaded limiters/compressors.

Further advantages regarding elimination of artifacts can be achieved using so-called band division, that is, separate processing of different frequency ranges of the audio signal by identical limiters/compressors with different parameters or by a combination of identical and different limiters/compressors with appropriately selected parameters. Dual-band and tri-band divisions can be used in this respect, for example. The corresponding signal processing blocks in FIG. 11 (e.g., adaptive release, fixed attack and adaptive attack) can likewise be carried out using band division.

The implementation of the system illustrated in FIG. 11 as an algorithm in a digital signal processor (DSP) provides the necessary flexibility to realize the discussed combinations and selection of suitable parameters.

The method described above can easily be implemented in a digital signal processor. The compressor (or—dependent on the compression ratio—also called limiter) comprises a controlled amplifier having an input terminal, an output terminal and a control terminal for controlling the gain of the controlled amplifier, a feedback network connecting the output terminal and the control terminal of the controlled amplifier for determining the gain control characteristic, the feedback network having a first mode (attack) of operation and a second mode (release) of operation for controlling the gain of the controlled amplifier, where the feedback network is adapted for controlling the gain using an adaptive control characteristic in the first mode of operation and adapted for controlling the gain using a fixed control characteristic or an adapted control characteristic dependent on the level of an output signal provided by the output terminal in the second mode of operation, the adaptive control characteristic being dependent on the level of an input signal received by the input terminal.

Figure 10:
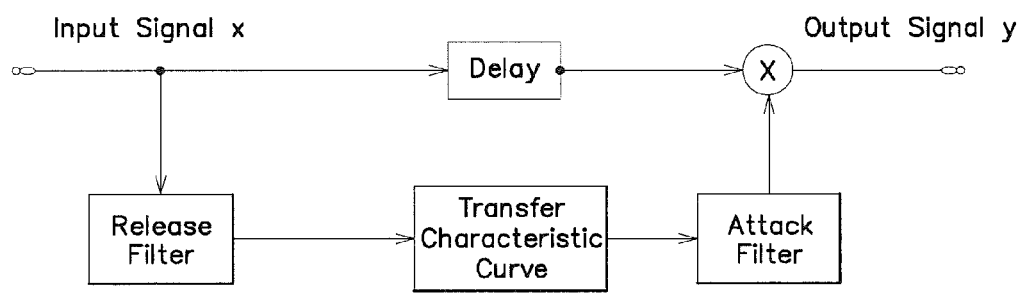
FIG. 10 illustrates another limiter with a feed forward structure.
Figure 12:
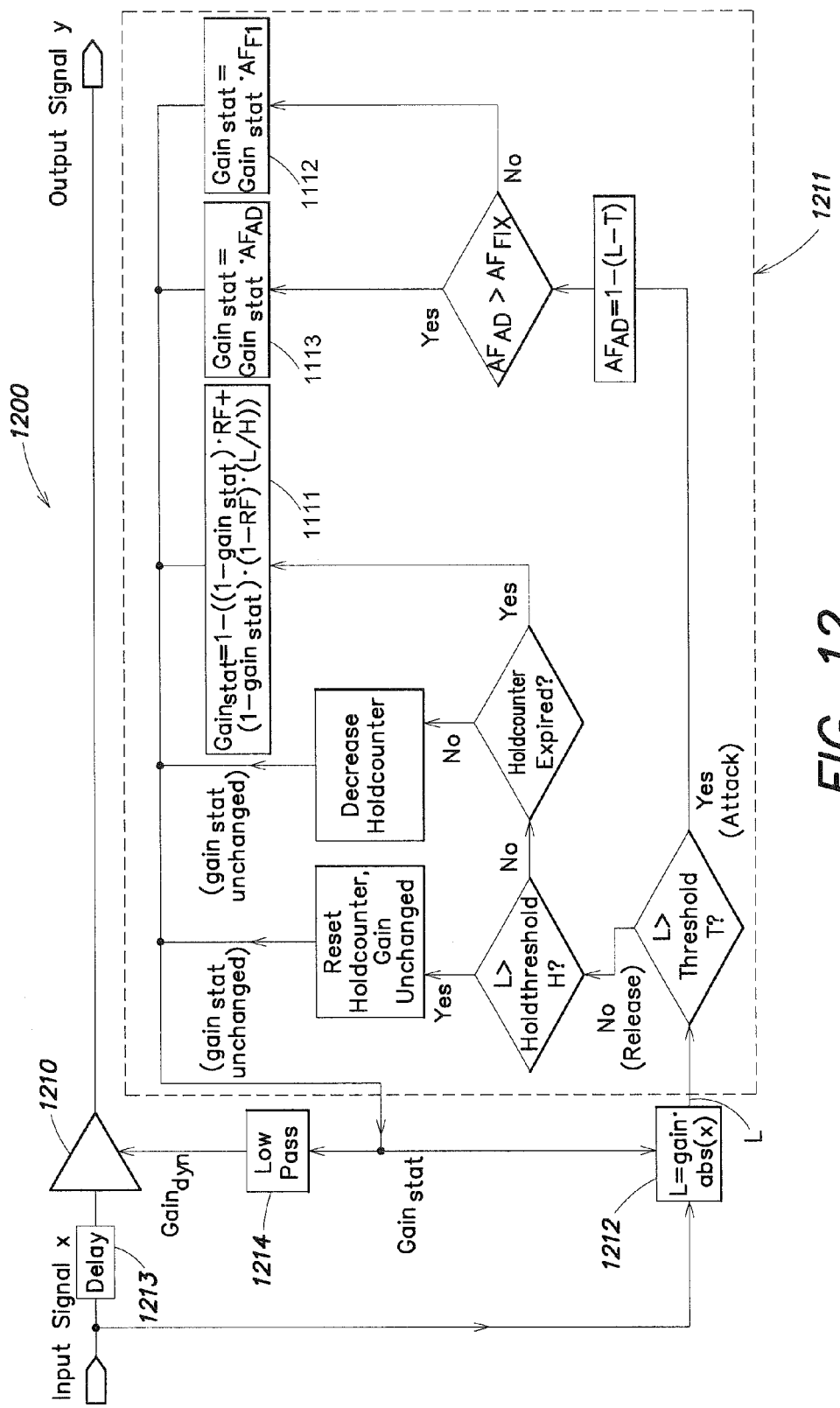
FIG. 12 illustrates a more detailed embodiment of the compressor/limiter.

Another exemplary limiter 1200 which incorporates the same concept as the limiter of FIG. 11 is shown in FIG. 12. It makes use of a suitable combination of both fixed and adaptive characteristic curves for the parameters attack time $t_A$ and release time $t_R$ and attack factor AF and release factor RF respectively. In contrast to the example of FIG. 10, the limiter of FIG. 11 does not use the feedback structure of FIG. 4, but the feedforward structure with an underlying feedback loop as illustrated in FIG. 6.

An input signal x is delayed by a delay line 1213, the delayed input signal is then amplified by an amplifier 1210 with a variable gain $gain_{dyn}$. The output signal of the amplifier is the output signal y of the limiter. The gain $gain_{dyn}$, of the amplifier 1210 is derived from a static gain $gain_{stat}$ which is calculated by a feedback loop 1211.

The (undelayed) input signal x is fed into a feedforward structure 1212 whose output out is supplied as an input to the feedback loop 1211. The feedforward structure 1212 is adapted for calculating an output signal by amplifying the absolute value of the input signal x by the static gain $gain_{stat}$, thus determining a measure for the total signal level L of the input level. It has to be noted that the signal level L can also be derived from the output signal y, as it is the case in the limiter of FIG. 11, or from another signal derived from the input signal.

In the feedback loop 1211 the calculated input signal level L is used to decide whether the limiter operated in the release mode or the attack mode. If the input signal level L is greater than the a limiter threshold T, then the feedback loop of the limiter operates in the attack mode, otherwise in the release mode.

In attack mode an adaptive attack factor $AF_{AD}$ is calculated dependent from the excess value of the input signal level L over the threshold level T, $$AF_{AD}=1-(L-T). \quad (7)$$

The adaptive attack factor $AF_{AD}$ is then compared with a fixed attack factor $AF_{FIX}$. If the adaptive attack factor $AF_{AD}$ is greater than the fixed attack factor $AF_{FIX}$, then the static gain $gain_{stat}$ is calculated using the adaptive characteristic ($AF_{AD}$), otherwise the static gain $gain_{stat}$ is calculated using the fixed characteristic ($AF_{FIX}$). In both cases the "new" gain value $gain_{stat}[k]$ is calculated from a previous value $gain_{stat}[k-1]$ according to the following equation:

$$gain_{stat}[k]=gain_{stat}[k-1]\cdot AF, \quad (8)$$

where the attack factor AF is the adaptive attack factor $AF_{AD}$ or the fixed attack factor $AF_{FIX}$ respectively. However, for a small excess values of the input signal level over the threshold level T the limiter uses the adaptive control characteristic, because the adaptive attack factor $AF_{AD}$ is greater than the fixed attack factor $AF_{FIX}$. This limits the attack factor AF to a minimal value of the fixed attack factor $AD_{FIX}$. The properties of the limiter concerning pumping is thus improved. In the present example the adaptive attack factor $AF_{AD}$ is compared to the fixed attack factor $AF_{FIX}$ in order to decide whether to use the fixed control characteristic or the adaptive control characteristic to calculate the "new" value for the gain $gain_{stat}$. Comparing, if the excess value of the signal level L over the threshold level T is greater than a given value is, is equivalent. If the excess value is high enough, the fixed control characteristic is used ($AF=AF_{FIX}$), at small excess values the adaptive control characteristic ($AF=AF_{AD}$).

In the release mode the input signal level L can be compared to a further threshold level which is also referred to as "hold-threshold level" H and which is typically 1 dB below the threshold level T. If the input signal level L is higher than this hold-threshold level H the actual static gain $gain_{stat}$ remains unchanged, and a hold-counter is reset to a given value (e.g., an integer value greater zero).

If input signal level L falls below this Hold-threshold level H, the value of the hold-counter is checked. If the hold-counter is not yet expired (i.e., it is greater than zero), then the actual static gain $gain_{stat}$ remains unchanged, and the hold-counter is decremented by a certain decrement (e.g., by one). If the hold-counter has expired (i.e., it equals zero), then the gain is adjusted according to the following equation:

$$gain_{stat}[k]=1-((1-gain_{stat}[k-1])\cdot RF+(1-gain_{stat}[k-1])\cdot(1-RF)\cdot(L/H)). \quad (9)$$

The above equation again represents an adaptive gain control characteristic, since it considers the input signal level L. The Hold-threshold H as well as a constant release factor RF which is, for example, calculated according to equation (6) are also considered. In the equation (8) the Hold-threshold H maybe replaced by the (attack) threshold level T.

The static gain $gain_{stat}$ can be regarded as an output of the feedback loop 1211. The variable gain amplifier does not directly use the static gain $gain_{stat}$ as calculated in the feedback loop 1211, but a "smoothed" version thereof. The sequence of static gain values $gain_{stat}[k]$ is fed into a smoothing filter 1214 for removing distortions from the static gain values.

In a digital implementation of the limiter in a digital signal processor, the feedback loop can operate at a downsampled sampling rate, that is, the calculations in the feedback loop are performed at a, for example, eight times slower clock rate than the rest of the limiter. In this case the smoothing filter can also act as a interpolation filter for up-sampling the static gain values calculated by the feedback loop 1211.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A method for amplifying an input signal with a controlled gain, comprising the steps of:
   providing an output signal representing the input signal amplified by an initial gain;
   determining a signal level of the input signal or of the output signal;
   comparing the signal level with a threshold level;
   if the signal level is below the threshold level, updating the initial gain value using an adaptive control characteristic; and
   if the signal level is above the threshold level, updating, dependent on the signal level, the initial gain value using a fixed control characteristic or an adaptive control characteristic respectively;
   where the adaptive control characteristic is dependent on the signal level and the fixed control characteristic is independent from the signal level.

2. The method of claim 1, where
   the initial gain value is updated according to the fixed control characteristic if the signal level exceeds the threshold level by more than a given excess value and where
   the initial gain value is updated according to the adaptive control characteristic if the signal level exceeds the threshold level by less than the given excess value.

3. The method of claim 1, where the control characteristic depends on an attack time parameter, if the signal level is above the threshold level.

4. The method of claim 1, where the control characteristic depends on a release time parameter, if the signal level is below the threshold level.

5. The method of claim 4, comprising the following steps:
   if the signal level is below the threshold level, determining whether the signal level exceeds a further threshold value, and
   resetting a hold-counter if the signal level exceeds the further threshold value,
   the gain remaining unchanged and the threshold value being greater than the further threshold value.

6. The method of claim 5, comprising the following step:
   if the signal level does not exceed the further threshold value and if the hold-counter has not expired, modifying the hold-counter.

7. The method of claim 6, comprising the following step:
   if the signal level is below the further threshold level and if the hold-counter has expired, setting the release time parameter dependent on the signal level.

8. The method of claim 1, comprising:
band-pass filtering an audio-signal for providing the input signal.

9. A compressor comprising:
a controlled amplifier that receives an input signal and provides an output signal, and a control terminal for controlling the gain of the controlled amplifier,
a feedback network connected to the control terminal of the controlled amplifier, the feedback network having a first mode of operation and a second mode of operation for controlling the gain of the controlled amplifier, where
the feedback network is adapted for controlling the gain using, dependent on an signal level of the input signal or of the output signal, an adaptive control characteristic or a fixed control characteristic in the first mode of operation and an adaptive control characteristic in the second mode of operation,
where the adaptive control characteristic is dependent on the signal level and the fixed control characteristic is independent of the signal level.

10. The compressor of claim 9, further comprising a band-pass filter that receives an audio signal and providing the input signal to the controlled amplifier.

11. The compressor of claim 9, where the control characteristic is dependent on an release time parameter in the second mode of operation.

12. The compressor of claim 11, where the feedback circuit is adapted for setting the release time parameter dependent on the signal level.

13. The compressor of claim 9, where the control characteristic depends on an attack time parameter in the first second mode of operation.

14. The compressor of claim 13, where the feedback circuit comprises:

means for determining the excess of the threshold signal level over the signal level,
means for setting the attack time parameter to a fixed value, if the excess value is above a certain value, and
means for setting the attack time parameter to a value dependent on the excess value, if the excess value is below above a certain value.

15. The compressor of claim 9, comprising a smoothing filter being connected between the controlled amplifier and the feedback network for removing distortions from the gain values.

16. The compressor of claim 15, where the smoothing filter operates as interpolation filter for upsampling the sequence of gain values.

17. A method for amplifying an input signal with a controlled gain, comprising:
providing an output signal representing the input signal amplified by an initial gain;
determining a signal level of one of the input signal and the output signal;
comparing the signal level with a threshold level; and
updating the initial gain value using a control characteristic, where
if the signal level is below the threshold level, the control characteristic is adaptive and dependent on the signal level; and
if the signal level is above the threshold level, the control characteristic is adaptive and dependent on the signal level during a first signal dependent mode of operation, and the control characteristic is fixed and independent from the signal level during a second signal dependent mode of operation.

* * * * *